United States Patent [19]

Wang

[11] 3,886,583

[45] May 27, 1975

[54] INSULATED GATE-FIELD-EFFECT TRANSISTOR

[75] Inventor: Raymond C. Wang, Tempe, Ariz.

[73] Assignee: Motorola, Inc., Chicago, Ill.

[22] Filed: Oct. 23, 1973

[21] Appl. No.: 408,984

Related U.S. Application Data

[63] Continuation of Ser. No. 158,723, July 1, 1971, abandoned.

[52] U.S. Cl. ...................... 357/23; 357/41; 357/42; 357/52

[51] Int. Cl. ........................................ H01l 11/14

[58] Field of Search ........ 317/235 B, 235 G, 234 L; 357/23, 41, 42, 52

[56] References Cited

UNITED STATES PATENTS

| | | | |
|---|---|---|---|
| 3,356,858 | 12/1967 | Wanlaps | 307/88.5 |
| 3,567,509 | 3/1971 | Kuiper | 117/217 |
| 3,665,594 | 5/1972 | Raithel | 29/590 |

OTHER PUBLICATIONS

Faggin et al.; Solid-State Electronics, Vol. 13, Pergamon Press, 1970, pp. 1125–1143.

*Primary Examiner*—Martin H. Edlow

*Attorney, Agent, or Firm*—Vincent J. Rauner; Charles R. Hoffman

[57] ABSTRACT

There is disclosed an improved insulated gate field-effect transistor having a reduced gate voltage associated with the use of an aluminum-silicon gate electrode in which the electrode is composed of 90% aluminum and 10% silicon by weight. The use of the aluminum-silicon electrode in the weight percentages indicated permits the fabrication of complementary insulated gate field-effect transistors, both of which having as low a gate voltage as that of a corresponding "silicon gate" device without the inherent processing problems and reliability difficulties of the silicon gate devices. The improved complementary insulated gate field-effect transistor device is made by standard C-MOS processing techniques with the major difference in processing being the co-evaporation of aluminum and silicon during the gate electrode deposition in lieu of evaporation of pure aluminum.

2 Claims, 10 Drawing Figures

INVENTOR.
Raymond C. Wang
BY
Mueller & Aichele
ATTY'S

INVENTOR.
Raymond C. Wang
BY
Mueller & Aichele
ATTY'S

INSULATED GATE-FIELD-EFFECT TRANSISTOR

This is a continuation, of application Ser. No. 158,723 filed July 1, 1971 now abandoned.

BACKGROUND OF THE INVENTION

This invention relates to insulated gate field-effect transistors and more particularly to both a method and apparatus for lowering the gating threshold of an insulated gate field-effect transistor by providing a gate electrode of aluminum and silicon.

The subject device is an "insulated gate field-effect transistor" (IGFET) having an aluminum-silicon gate electrode. Hereinafter the subject device will be contrasted with other IGFETs such as the "silicon gate" IGFETs and the aluminum gate" IGFETs. This latter IGFET, because its gate is a pure metal is referred to as a metal oxide semiconductor field-effect transistor (MOSFET) or more simply as an MOS device.

Although there are other more exotic MOS devices having gates of molybdenum, the MOS devices referred to hereinafter are those having aluminum gates. These aluminum gated devices have been known for many years and have an established reliability throughout the industry such that the term MOS is almost always synonymous with aluminum gate devices.

There is however an outstanding problem with aluminum gate MOS devices in that the gate voltage necessary to render the P-MOS device conductive has always been at or above a 2-volt level. After many attempts in the past to reduce the gating threshold of these P-MOS devices to a 1-volt level compatible with 1.5 volt power supplies, and after considerable experimentation with standard MOS techniques and parameters, the industry, in an effort to solve the high threshold problem has concentrated on the development of "silicon gate" IGFETs and exotic "molybdenum gate" IGFETs. These developments, while successful in reducing the gate voltage necessary to render the devices conductive, have introduced many processing difficulties and have resulted in devices whose reliability is in question. It will be noted that the standard "aluminum gate" MOS device is reliable and can be fabricated in a reproducible manner such that high yields are commonplace. However, up until the present time, it has been impossible to fabricate the P-type MOS devices (P-MOS) with thresholds less than 1 volt.

The necessity of providing devices which have low thresholds is three-fold. First and most obvious is the necessity of making these devices compatible with portable 1.5-volt power sources. The second and most important consideration is power consumption of the circuits in which semiconductor devices are used. It will be appreciated that field-effect transistors in general utilize almost an order of magnitude less power than do bipolar transistor devices. Since power is the product of voltage and current, by reducing the voltage at which the devices are rendered conductive considerable power savings can be achieved when a large number of devices are in a circuit. The reduction in gating threshold of a device of 2 volts to 1 volt or less, therefore, represents a considerable power savings. This is especially true when large numbers of complementary IGFET devices are used. Third, with the same power supply, the lower threshold device will have a greater output voltage swing and thus a greater current gain.

Examples of the applications in which power savings are critical include battery-powered hearing aids, pace makers and electronic watch circuits. In watch circuits, a large number of insulated gate field-effect transistors are utilized in dividing down oscillator frequencies. It will be further appreciated that low power consumption transistors must be utilized in such portable applications as cameras in which light reading are converted into aperture and exposure settings automatically by integrated circuits within the camera.

Thus, the interest of the industry in devising reliable semiconductor devices having lower gate thresholds can be seen. It is a finding of this invention that an aluminum-silicon gate electrode not only provides the needed gate electrode for IGFETs, but also reduces the gating threshold of the device. It is a further finding that this lower gating threshold is associated with a specific aluminum-silicon alloy composition. More specifically, when gate electrodes are composed of approximately 90% aluminum and 10% silicon, the gate voltage of a P-type IGFET is as low as 0.7 volts. It will be appreciated that ohmic contacts to silicon have been made utilizing the co-evaporation of an aluminum-silicon alloy in which the eutectic composition is approximately 10% silicon by weight. This is shown by the technical notes published by the Radio Corporation of America which is cited as RCA TN No. 8 and is entitled "Method of Making Ohmic Contacts to Silicon" by Herbert Kroemer. It will be apparent that this article or technical note does not refer to any improvement in the functioning of a field-effect device but merely relates to the ability to make an ohmic contact to silicon utilizing an aluminum-silicon alloy. Likewise, in the U.S. patent to L. L. Kuiper, No. 3,567,509, issued Mar. 2, 1971, an aluminum-silicon alloy is utilized to contact a silicon substrate. Again, in this patent, no reference is made to the ability of such a contact to substantially improve the functioning of an insulated gate field-effect transistor device by reducing its gate threshold voltage. In fact, since 1957, which is the date of the RCA technical note, it would appear that nobody has utilized this contact in an insulated gate field-effect transistor application; for if they had, the industry would not have gone to the silicon gate or molybdenum gate devices in order to reduce gating thresholds. The conspicuous absence of the use of aluminum-silicon contacts as a gate electrode for field-effect devices is interesting in view of the article by H. S. Lehman, entitled "Chemical and Ambient Effects on Surface Condition in Passivated Silicon Semiconductors" which was presented at the IEEE Solid-State Device Research Conference, Boulder, Colo. July 1, 1964, and published in the *IBM Journal* in September of 1964 at page 422 et sequi. This paper outlined a great many metals utilized as gate electrodes and yet does not mention an aluminum-silicon alloy. Nor would it be obvious from the parameters shown for aluminum and silicon taken singly what the gating threshold would be for an alloy of aluminum and silicon used as an IGFET gate electrode. Thus, while aluminum-silicon eutectics have been used in the past for making ohmic contact to silicon, the unique property of this eutectic in lowering gate threshold voltages of field-effect transistors has not generally been recognized.

Not only does the 90% aluminum — 10% silicon eutectic result in an unexpected lowering of the gate threshold voltage for insulated gate field-effect transistors, it also permits the use of standard C-MOS fabrication techniques whose reliability is now beyond question. In standard C-MOS fabrication, the metal gate electrode (as well as the source and drain contacts) is deposited by vacuum deposition in which the metal is evaporated from a metal pellet in a vacuum deposition chamber. By merely co-evaporating aluminum and silicon from separate pellets during the metallization step of the C-MOS fabrication procedure, a device having both contact metallization and considerably lower gating thresholds is produced. By slight further alterations in the substrate concentration and the insulated gate oxide thickness, the less than 1-volt gating threshold is achieved. For instance, the normal doping concentration in the N-type substrate of a field-effect transistor is on the order of $1 \times 10^{15}$ atoms per cubic centimeter. This doping concentration in the subject insulated gate field-effect transistor is reduced to $6 \times 10^{14}$ atoms per cubic centimeter. If, however, the substrate doping concentration is made much lighter, the surface states generated would be sufficient to turn the device "on," causing leakage and logic failure. Thus, it was found that a doping concentration of $\sim 6 \times 10^{14}$ atoms/cubic centimeter is a lower limit for all practical purposes. With respect to the thickness of the thermally grown oxide, in most MOS devices this is on the order of 1,200 angstroms. In the subject device, the thickness of the thermally grown oxide is reduced to between 750 and 900 angstroms without seriously creating pinhole and breakdown problems. Although the lower limit on the thickness of the gate oxide is on the order of 750 angstroms for practical purposes, this invention is not limited thereto.

Thus, by use of the specific aluminum-silicon eutectic described herein in combination with changes in the substrate doping concentration and the insulated gate oxide thickness, the 2-volt gate threshold for P-type MOS devices has been lowered to less than 1 volt without the necessity of utilizing complicated silicon gate technology or exotic metal gate techniques.

SUMMARY OF THE INVENTION

It is therefore an object of this invention to provide an improved insulated gate field-effect transistor.

It is a further object of this invention to provide the standard insulated gate field-effect transistor with a gate electrode made from an eutectic of aluminum and silicon for reducing the gate threshold of the device.

It is a still further object of this invention to provide an improved complementary insulated gate field-effect transistor device having low gating thresholds and utilizing standard metal oxide semiconductor production techniques in which the gate electrodes are alloys of aluminum and silicon, and in which the weight percentages of the constituents of the gate electrodes are 90% aluminum and 10% silicon and in which both the gate oxide thickness and the substrate doping concentration are reduced.

It is a still further object of this invention to provide the combination of an insulated gate field-effect transistor gate and an aluminum-silicon gate electrode.

It is yet another object of this invention to provide a method for lowering the gating threshold of an insulated gate field-effect transistor.

Other objects and features of this invention will become more fully apparent upon reading the following description taken in connection with the accompanying drawings.

BRIEF DESCRIPTION OF THE INVENTION

Figure 1A:
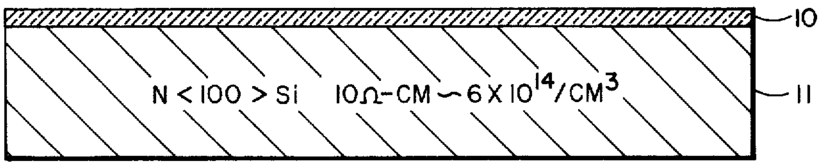
FIGS. 1*a* through 1*j* show cross-sectional diagrams of intermediate and final structures derived in the fabrication of a complementary insulated gate field-effect transistor device indicating one method of manufacturing the device with aluminum-silicon alloy gate electrodes.

There is disclosed an improved insulated gate field-effect transistor having a reduced gate voltage associated with the use of an aluminum-silicon gate electrode in which the electrode is composed of 90% aluminum and 10% silicon by weight. The use of the aluminum-silicon electrode in the weight percentages indicated permits the fabrication of complementary insulated gate field-effect transistors, both of which having as low a gate voltage as that of a corresponding silicon gate device without the inherent processing problems and reliability difficulties of the silicon gate devices. The improved complementary insulated gate field-effect transistor device is made by standard C-MOS processing techniques with the major difference in processing being the co-evaporation of aluminum and silicon during the gate electrode deposition in lieu of evaporation of pure aluminum.

DETAILED DESCRIPTION OF THE INVENTION

This invention relates generally to reducing the gating threshold beyond that which was obtainable in standard P-MOS devices. For standard N-MOS devices, low gating thresholds are not now a problem. However, when a standard P-MOS device is combined with a standard N-MOS device to form a complementary metal oxide semiconductor (C-MOS), the problem is providing the P-MOS device with a low gating threshold to match that of the N-MOS device. This invention alters the gate metallization step in an otherwise standard MOS processing technique to achieve the equivalent of a low threshold P-MOS device without significantly affecting the low voltage and normal functioning of an equivalent N-MOS device. The word "equivalent" is used to indicate that the subject device, be it P-type or N-type, is not truly a metal oxide semiconductor since it has an Al-Si gate. However, in all other aspects, the subject device is fashioned like a traditional aluminum gate MOS device. This is important because no exotic techniques are necessary to produce a reliable complementary pair of devices, both having low gating thresholds.

As was mentioned hereinbefore, reducing the gate threshold was attempted by varying various of the MOS parameters. The most important of these parameters in determining the gating threshold are: The Fermi level of the substrate; the surface states at the interface between the gate electrode and the insulating layer and the interface between the insulating layer and the inversion channel; the work function difference between the gate electrode and the substrate; and the bulk charge term which refers to substrate doping. Of these terms the work function difference term, $\phi_{ms}$, turns out to be the most important term in the lowering of the gating threshold (herein referred to as $V_T$) for the P-type device. In the first part of the description, a P-type IGFET is described since it is the P-type device in which it is most difficult to reduce the gate threshold.

This will become apparent by reference to the following equation in which the gating threshold is related to the above-mentioned parameters: For a P-type IGFET $$V_{T_P} = 2\phi_{FN} + \phi_{ms} - \frac{Qss}{Co} - V_B \quad (1)$$

where $2\phi_{FN}$ is the Fermi level of the N-type substrate, $\phi_{ms}$ is the work function difference of gate electrode and substrate, $Qss/Co$ is the surface state term and $V_B$ is the bulk charge term. A P-type IGFET turns "on" with a negative gate voltage. To reduce the gate voltage threshold of a P-type IGFET is to make the gate threshold voltage "less negative."

Here $2\phi_{FN}$ has a negative value; $Qss/Co$ has a positive value; $V_B$ has a positive value; and $\phi_{ms}$ normally (with aluminum gate devices) has a negative value. Thus all the terms in equation (1) are negative terms. By causing one of them to go positive, the gate threshold can be lowered or made to go "less negative." The term affected by the use of an aluminum-silicon gate is the $\phi_{ms}$ term. Normally this term is about −0.32 volts. However, with the use of the aluminum-silicon gate this term becomes positive and is thought to be greater than +0.1. Heretofore, $\phi_{ms}$ has never been a positive number for aluminum gate P-MOS devices. Now by the simple substitution of Al-Si metallization for Al metallization in standard C-MOS processing, the P-type device "turn-on" threshold has been brought down to a gate voltage having an absolute value as low as 0.7 volts.

The effect of using an aluminum-silicon gate on an N-type device is negligible, since for an N-type device $$V_{T_N} = 2\phi_{FP} + \phi_{ms} - \frac{Qss}{Co} + V_B \quad (2)$$

where $2\phi_{FP}$ has a positive value, $\phi_{ms}$ has a negative value, $Qss/Co$ has a positive value and $V_B$ has a positive value. Here the N-type device is turned "on" by a positive gate potential. In this case $\phi_{ms}$ and $Qss/Co$ are effectively negative values bringing down the gating voltage. In fact if $Qss/Co$ is not small, the device will be a normally "on" device. $\phi_{ms}$ is normally −1.0v and does not vary by more than ±0.1v with the substitution of Al-Si for Al as a gate material.

Thus it is possible to improve the performance of any C-MOS device by using an aluminum-silicon metallization step instead of a pure aluminum metallization step. When this is done the device is more properly called a complementary IGFET (C-IGFET) since it is no longer a C-MOS device having pure metal gates.

As to the $2\phi_F$ and $V_B$ in equations (1) and (2), they are substantially invarient. A subtle point can, however, be made with respect to the $Qss/Co$ term insofar as it relates to Al-Si gate C-IGFET devices. With certain dry gate oxidation processing techniques which result in a slow growth of the gate oxide, $Qss/Co$ can be made to approach 0v. This is immediately beneficial with respect to the stability and frequency response. Reducing $Qss$ also lowers gate threshold voltage of the P-type device as can be seen by equation (1). However, a lower $Qss$ value raises the N-type device gating threshold indicated by equation (2). In general, this rise is oftentimes necessary to get the N-IGFET to be "off" in normal operation which is the desired normal condition for both the P and N IGFET.

The use of the aluminum-silicon gate electrode is thus the key to low gating complementary IGFET devices. Its presence makes $\phi_{ms}$ in the threshold equation of the P-type device go positive, while at the same time the use of the Al-Si gate does not affect the N-type device in the complementary pair.

An alternate explanation of the phenomena governing the low gating threshold can be understood by considering that the MOS device threshold is a function of the flat band voltage, bulk doping, gate oxide thickness, and source-bulk bias. When the surface potential is bent twice the amount of the bulk Fermi level, the gate voltage is defined as the device threshold. The first two terms of equation (1), $\phi_F$ and $\phi_{ms}$, are dependent only on bulk doping and material used. The next term $Qss/Co$ is a measure of the fixed charge in the oxide or at the interface. $Qss$ is of course dependent upon the process and crystal orientation. For IC processing using <100> material, the typical value for $Qss/q$ is $1 \times 10^{11}$ $cm^{-2}$. This is equivalent to 0.45v for 1.0KA gate oxide. The last term is the bulk charge term which is dependent upon bulk doping and gate oxide thickness.

With recent interest in low threshold processes, the standard C-MOS processing can be modified by changing the substrate from 5 Ω-cm to 10 Ω-cm and reducing the gate oxide thickness from 1,200A to 750A (or to 600A with $SiO_2$ - $Si_3N_4$ structures). Results indicate the thresholds are reduced from (2.0 ± 0.2) v for the standard process to (1.0 ± 0.3) v for N-MOS and (1.5 ± 0.3) v for P-MOS when regular aluminum gate electrodes are used.

In order to have the threshold voltages for both P-MOS and N-MOS in the order of 0.7 volts, there are two terms left in equation (1) which can be varied. By forward biasing the source-bulk junction, the bulk charge term could be reduced or completely eliminated. However, the forward biasing currents will be larger than the entire circuit drain, thus making the technique undesirable.

This leaves the threshold reduction possibility to the last term, $\phi_{ms}$. The term $\phi_{ms}$ in Al-$SiO_2$-Si systems is always negative as mentioned before. This makes N-MOS thresholds low and P-MOS thresholds high. The present Al-Si gate electrode changes the sign of the $\phi_{ms}$ term for P-MOS devices, enabling the low 0.7-volt gating threshold.

What makes the use of aluminum-silicon alloys unobvious over the pure aluminum MOS devices and the pure polysilicon gate devices is that there was no way to predict that the use of silicon and aluminum as a gate material would not result in the N-MOS device having a higher gating threshold. It was further not obvious that such a small amount of silicon in aluminum would produce, in the P-MOS device, a positive $\phi_{ms}$ term.

It will be appreciated that the use of an aluminum-silicon alloy in which at least 10% of the alloy is silicon by weight is not to be construed as a limitation on the percentages of aluminum and silicon. It will be apparent, however, that the more silicon utilized with the aluminum, the lower presumably will be the gating threshold at least insofar as P-MOS devices are concerned. There are, however, processing problems involved when the amount of silicon being co-evaporated with the aluminum is increased. Reducing the amount of silicon from 10% results in a corresponding increase in gating threshold for the P-MOS device. Therefore, in the preferred embodiment the aluminum-silicon alloy contains approximately 90% aluminum and 10% silicon.

PROCESSING

For reference, one standard approach for fabricating field-effect transistors is shown in the patent to J. Lindmayer, U.S. Pat. No. 3,386,016, issued May 28, 1968. It will be appreciated that in this patent the metal gating electrode is electrode 20 which according to this patent is a deposited metallic layer put down by a plating vapor deposition or the like. It is in this vapor deposition step that co-evaporation of the aluminum-silicon alloy is accomplished. This can also be done in the method prescribed by the patent to L. L. Kuiper, referred to hereinabove. It will be appreciated that in the Kuiper patent, co-evaporation is the result of the use of a silicon pellet in close proximity to the substrate and an aluminum pellet in the filament of the evaporator somewhere there below such that when both the aluminum and silicon are heated, the required aluminum-silicon alloy is formed at the gate portion of the field-effect transistor.

The aluminum-silicon alloy gate may also be formed by the formation of a pellet of an aluminum-silicon alloy having a composition substantially equal to or close to that of the aluminum-silicon eutectic to be formed. When this pellet is placed in the filament of an evaporator and heated, the desired alloy is formed from the evaporated material.

THE PREFERRED PROCESS

The preferred process for fabricating complementary IGFETs of the subject configuration is now described. It differs from conventional C-MOS processing primarily in that the metal deposition step normally utilized is supplanted with a step involving the co-evaporation of aluminum and silicon.

Referring now to FIGS. 1*a* through 1*j*, a series of structures are shown indicating this preferred method of fabricating complementary insulated gate field-effect transistors in which both the P-type and N-type devices have low thresholds on the order of 1 volt or less.

In the first step of the process, as shown in FIG. 1*a*, a thermally grown layer of silicon oxide 10 is shown on a silicon substrate 11. The oxide is formed from a steam ambient at 1,200°C with the layer being approximately 5,000 angstroms in thickness. The substrate has the usual <100> crystallographic orientation which is the orientation which yields the lowest gating voltages. Unlike the N-type substrates used in conventional C-MOS fabrication, here the N-type substrate has a resistivity of 10 ohm-centimeters as opposed to the 5 ohm-centimeter resistivities in the C-MOS cases. This gives the substrate an N-type doping concentration of approximately $6 \times 10^{14}$ atoms per cubic centimeter in the C-IGFET case. The thermal oxide is conventionally grown in an epi reactor.

Figure 1B:
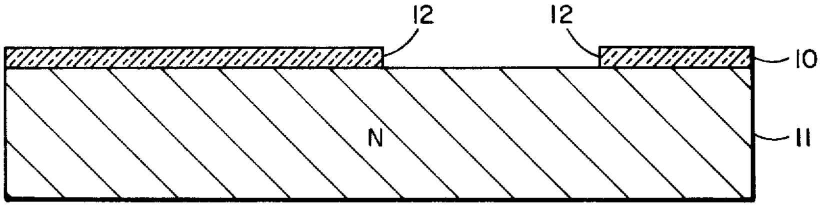
Figure 1C:
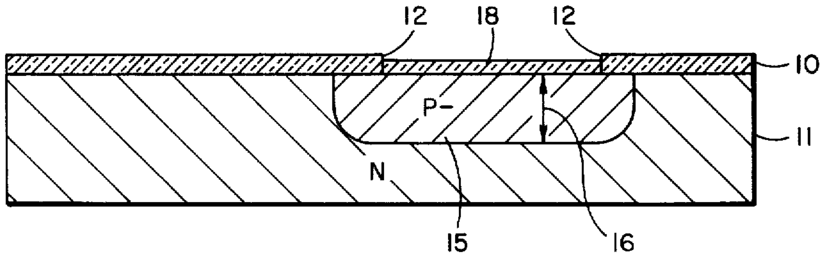

As shown in FIG. 1*b*, a $P^-$ tub window is defined in the $SiO_x$ layer 10 as shown by the window 13. The oxide layer is conventionally masked by a photoresist such as KMER and is etched by a buffered hydrogen-fluoride solution.

Thereafter, P-type impurities are diffused through the window 12 so as to form the $P^-$ tub region 15. In general, the depth of diffusion is 10 microns as shown by the arrow 16 in which the diffused region has a sheet resistivity at the surface of 1,000 ohms per square. The diffusion is essentially a two-step process involving pre-deposition of the dopant in doped oxide form and a driving-in step. The pre-deposition is done at 950°C in a dynamic open tube diffusion with liquid boron tribromide as the doping source. The carrier gas is nitrogen or oxygen. The oxygen carrier is preferred to facilitate the decomposition of $BBr_3$ into $B_2O_3$ as the local diffusion source and to form a protective oxide layer on top of the silicon surface by oxidizing the surface. In the driving-in step, the impurities from the local diffusion source are driven in at a higher temperature usually around 1,115°C to redistribute the impurities carried by the $B_2O_3$ into the substrate. With the usage of a liquid source, there is no attempt to control diffusion parameters such as diffusion depth and sheet resistance by any other variables than the pre-deposition temperature which determines the impurity concentration of the doped oxide ($B_2O_3$).

This diffusion process results not only in the diffused region 15 but also in a thin oxide layer 18 above the diffused region which is bounded by the edges of the window 12. The pre-deposition region has an extremely high impurity concentration and is accompanied by a slight growth of oxide thereon. The pre-deposition can be followed by a cleaning and oxidation step in which a silicon oxide is grown on top of the very thin oxide above the heavily doped oxide region. This produces an oxide layer of substantial thickness on top of the heavily doped surface region. The impurity atoms are derived from the heavily doped surface region and diffuse down into the substrate. To form the $P^-$ region with required doping concentration, the area within the window 12 is etched down a predetermined distance and the predeposition and driving-in steps again repeated. This provides that the doping concentration at the surface be lighter and that the diffusion be deeper, albeit containing less of an impurity concentration. It will be appreciated that if a more heavily doped diffusion is desired, the etching step and the repetition of the pre-deposition and driving-in steps are omitted.

Figure 1D:
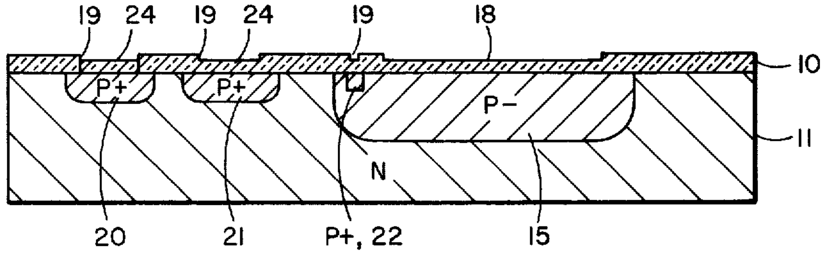

Referring now to FIG. 1*d*, silicon oxide layer 10 is etched over the areas in which the source and drain diffusions are to be made for the P-type IGFET. Additionally, the layer 10 is etched so as to provide for a $P^+$ heavy diffused contact region, 22, for the $P^-$ tub of the N-type IGFET. These etched areas are shown by the reference characters 19 and are made by conventional masking and etching techniques as hereinbefore described. Thereafter a $P^+$ diffusion is made resulting in the source and drain regions shown by the reference characters 20 and 21, respectively, as well as the aforementioned $P^+$ contact region 22. This diffusion process is similar to the diffusion process indicated for the region 15 except that the regions are not etched and the process is not repeated as was the case with the $P^-$ diffusion. It will be appreciated that this diffusion results in a silicon oxide layer 24 covering the regions 20, 21 and 22.

Figure 1E:
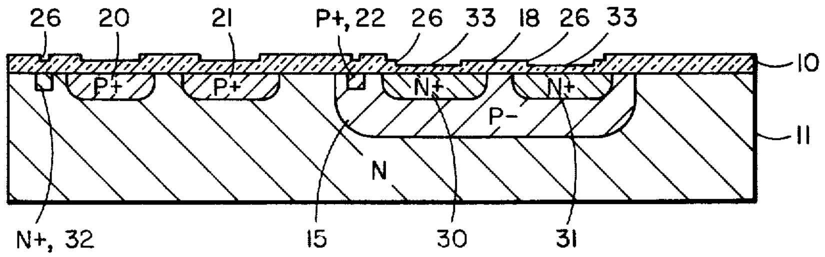

As shown in FIG. 1*e*, the layer 18 is etched at the regions 26 so as to permit the diffusions of the source and drain regions for the N-type IGFET. Additionally, layer 10 is cut so as to form an opening for an $N^+$ contact diffusion to the N-type tub of the P-type IGFET as shown also by the reference character 26. A phosphorus oxychloride liquid source in a nitrogen and oxygen carrier gas dopes the $N^+$ regions 30, 31 and 32, with the regions 30 and 31 being the source and drain regions, respectively, and with the region 32 being the $N^+$ diffusion contact region. The diffusion takes place at that temperature and for that length of time which assures that the depth of the $N^+$ regions 30 and 31 are approximately equal to the depth of the $P^+$ regions 20 and 21. It will be appreciated that the $N^+$ regions 30 and 31 also have oxide layers thereon as shown by the reference characters 33.

Figure 1F:
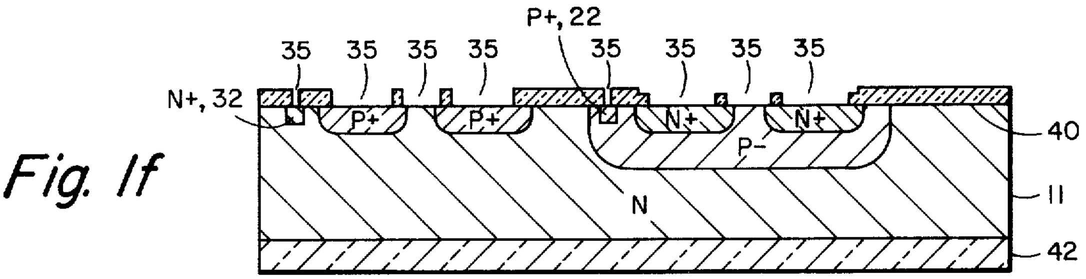

As shown in FIG. 1*f*, the pre-ohmic and gate cuts are made into the oxide layer on the structure thus formed as shown by the reference characters 35. This is accomplished by conventional masking and etching of the silicon oxide layers 10, 18, 24 and 33, which for the purposes of this process can be considered to be a continuous silicon oxide layer. It will be appreciated that there are etchants which will attack the silicon oxide but will not attack the silicon substrate such that the etching is stopped at the surface of the device as shown by the line 40.

Thereafter, a phossil backing layer and a pure glass capping layer is provided on the underneath side of the substrate 11 as shown by the composite layer 42. The purpose of the phossil backing layer is for gettering metallic impurities from the substrate. This layer is put on in a two-stage process which involves a phossil silicon oxide deposition at approximately 450°C followed by a deposition of pure silicon oxide. The first layer of phossil silicon oxide is approximately 5,000 angstroms in thickness while the pure silicon oxide cap is approximately 2,000 angstroms in thickness.

Figure 1G:
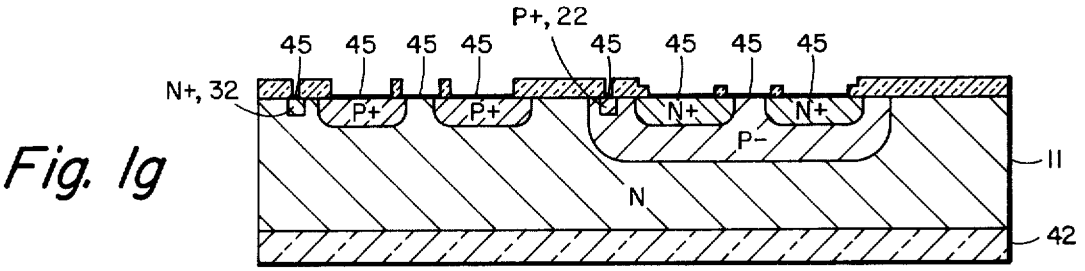

The gate oxidation step is shown with reference to FIG. 1*g*. It is a thermal oxidation step which takes place at approximately 1,115°C and may be performed in any manner which assures a slow growth of the oxide. The oxidation material is thermally grown on the areas exposed by the etch cuts 35 to a depth of between 750A – 900A. It will be appreciated that the gate oxidation may be a wet or dry process and should be grown relatively slowly so as to increase the electrical stability of the gate oxide. The position of the gate oxide is shown by the reference characters 45 in FIG. 1*g*. It is worthwhile to mention that it is during this high temperature step that the phossil backing layer performs the metallic impurities gettering.

Figure 1H:
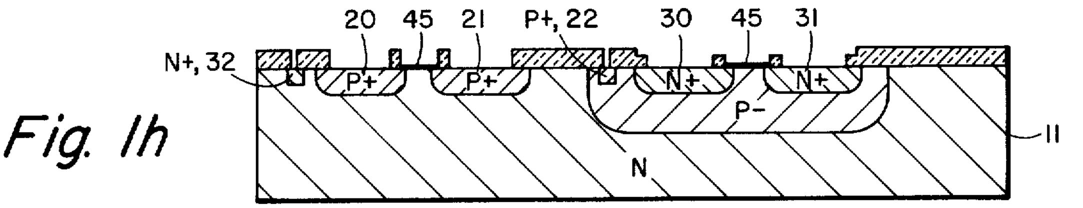

As shown in FIG. 1*h*, pre-ohmic cuts are made in the gate oxide so as to remove it from the source and drain regions of the complementary IGFETs as well as from the heavily doped contact diffusions. What remains are the gate oxide layers 45 with the surfaces of elements 32, 20, 21, 22, 30 and 31 being exposed. The phossil glass layers on the underneath side of the substrate are also etched away during this operation.

Figure 1I:
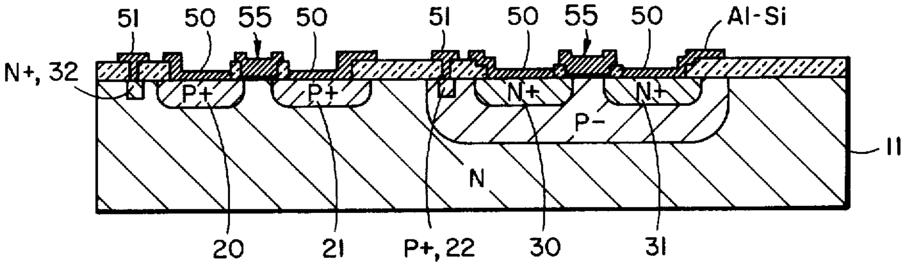
Figure 1J:
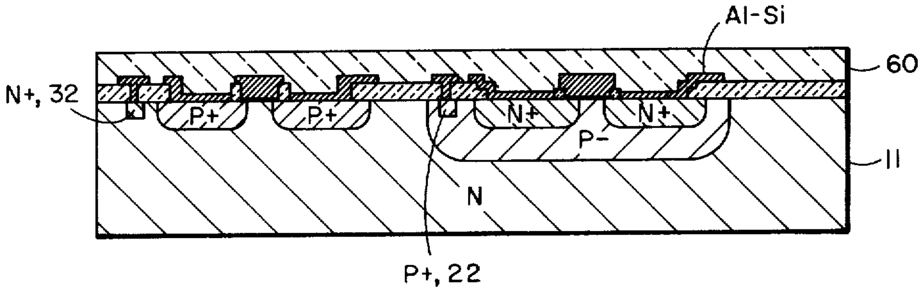

The metallization step shown in FIG. 1*i* is the step in the process which more than any other processing parameter contributes to the low gating threshold of the complementary devices. In this particular step there is a co-evaporation of aluminum and silicon on to not only the gate regions but also the source and drain regions. This metallization not only provides for ohmic contact to these regions, but also provides for the low gating threshold as described hereinbefore. The metallization is deposited across the entire top surface of the wafer from two evaporation sources. The first evaporating source carries pure aluminum. The silicon containing source is the second evaporating source. The substrate is housed in a vacuum deposition chamber and is heated to between 250°C and 350°C. It will be appreciated that this is a low temperature process. The source temperatures are controlled such that the evaporation rate of each element results in a deposit of a mixed layer of 90% aluminum and 10% silicon. Because of the low temperature deposition, it is difficult to say that the metallization layer is at this point in an alloyed condition.

It will be appreciated that the final alloy concentrations are dependent on the evaporation rate from the two sources. This evaporation rate is dependent upon the power delivered to the two sources and can be monitored by a silicon sensor which is in fact a quartz crystal which changes frequency dependent upon the amount of silicon formed thereupon. This frequency then measures the rate of silicon evaporation and such a sensor is used in a closed loop to control the power to the silicon source. It will be appreciated that in this process the aluminum evaporation rate is fixed and the evaporation rate of the silicon is varied so as to achieve the appropriate mixture of silicon and aluminum. In the preferred embodiment, the rates of evaporation which result in a 10% silicon, 90% aluminum alloy are an evaporation rate of 20 angstroms per second for silicon and 240 angstroms per second for aluminum. One additional advantage of the co-evaporation process over other types of processes for obtaining aluminum-silicon films is that the layer of aluminum-silicon thus deposited need not be heated so as to form an "alloy" to assure ohmic contact to the silicon. The term "alloy" in this sense refers to the penetration of the metal layer into the silicon substrate. At this point, however, due to the low temperature of the substrate, the aluminum-silicon layer itself may not in fact be an "alloy" (meaning an eutectic combination of the elements). Whether or not it is an "alloy" does not affect the "alloying" of the mixed aluminum-silicon layer to the silicon substrate.

As shown in FIG. 1*i*, the aluminum-silicon layer is patterned so as to form the appropriate contacts 50 to the source and drain regions 20, 21, 30 and 31. The patterning also defines the contacts 51 to the highly doped regions 32 and 22. Patterning also establishes the gate electrodes 55 which are the critical electrodes insofar as the reduced gating thresholds of the IGFETs are concerned.

Finally, in the fabrication of the completed complementary IGFET is the formation of a passivation layer 60 on top of the completed device. This passivation layer is typically phossil silicon oxide which is deposited and heated to a temperature of approximately 450°C for an extended period of time. It will be appreciated that exposing the substrate and components therein to a temperature of 450°C for an extended period of time results in alloying of the aluminum-silicon contacts in the sense that the mixed aluminum-silicon layer is now a true alloy. It will be appreciated that the passivation layer 60 is etched down to contact bonding pads (not shown) so that contact may be made to the bonding posts of the package in the assembly process.

The processing steps referred to hereinabove are similar to those utilized in the fabrication of conventional C-MOS devices. The primary difference is, of course, the use of an aluminum-silicon gate electrode so as to lower the gating threshold of the P-type IGFET while at the same time not causing a rise in the threshold of the N-type IGFET in the complementary device. A second difference over the processing steps utilized in C-MOS techniques is the use of a 10 ohm-centimeter substrate as opposed to the 5 ohm-centimeter substrate which is conventional. The aluminum-silicon metallization described herein not only functions as an ohmic contact to the silicon device, but more importantly functions to make feasible a low gating threshold P-type IGFET and therefore a low gating voltage complementary insulated gate field-effect transistor device.

Another advantage of the use of Al-Si is in preventing the electrochemical migration of Al during the alloy step, and in eliminating shorting the junction for shallower diffusion junction cases.

While the device described above is a complementary device, the aluminum-silicon gate electrode has a beneficial effect on single P-type IGFETs and the single Al-Si gate IGFET is considered to be well within the scope of this invention.

While the invention was described with respect to lowering gate thresholds below 1 volt due to the combined action of the aluminum-silicon gate electrode, the thin gate oxide and the reduced substrate concentration, it will be appreciated that using the aluminum-silicon electrode alone significantly lowers gating thresholds by itself. Further, without the aluminum-silicon electrode, the 1-volt threshold could not be achieved by standard C-MOS processing techniques.

What is claimed is:

1. An MOSFET device comprising, in combination P-type substrate, a N-type source region, an N-type drain region and an aluminum-silicon gate electrode therebetween, the threshold voltage of said MOSFET device being at least 0.5 volts less than an otherwise identical MOSFET device having a pure aluminum gate electrode, and aluminum-silicon metal electrode contacts to said source and drain regions of said MOSFET device.

2. The MOSFET device of claim 1 wherein said aluminum-silicon metal gate and source and drain electrodes being about 90% aluminum and 10% silicon by weight.

* * * * *